United States Patent
Son

(10) Patent No.: US 7,770,478 B2
(45) Date of Patent: Aug. 10, 2010

(54) APPARATUS AND METHOD FOR MEASURING CHUCK ATTACHMENT FORCE

(75) Inventor: Hyoung Kyu Son, Seoul (KR)

(73) Assignee: ADP Engineering Co., Ltd., Seongnam-si, Gyeonggi-do (KR)

( * ) Notice: Subject to any disclaimer, the term of this patent is extended or adjusted under 35 U.S.C. 154(b) by 0 days.

(21) Appl. No.: 12/342,535

(22) Filed: Dec. 23, 2008

(65) Prior Publication Data

US 2009/0107250 A1 Apr. 30, 2009

Related U.S. Application Data

(62) Division of application No. 11/872,081, filed on Oct. 15, 2007.

(30) Foreign Application Priority Data

| Nov. 3, 2006 | (KR) | 10-2006-0108175 |
| Nov. 3, 2006 | (KR) | 10-2006-0108176 |
| Nov. 3, 2006 | (KR) | 10-2006-0108177 |

(51) Int. Cl.
*G01N 19/04* (2006.01)
*H01L 21/683* (2006.01)

(52) U.S. Cl. ............... 73/865.9; 361/234

(58) Field of Classification Search .......... 361/234; 438/14–17; 73/865.9
See application file for complete search history.

(56) References Cited

U.S. PATENT DOCUMENTS

| 5,677,824 A * | 10/1997 | Harashima et al. ......... 361/234 |
| 5,684,669 A * | 11/1997 | Collins et al. ............. 361/234 |
| 5,917,327 A * | 6/1999 | Haley et al. .............. 324/457 |
| 5,946,183 A * | 8/1999 | Yamada et al. ............ 361/234 |
| 6,101,969 A * | 8/2000 | Niori et al. .............. 118/723 E |
| 6,104,595 A * | 8/2000 | Brown .................... 361/212 |
| 6,134,096 A * | 10/2000 | Yamada et al. ............ 361/234 |
| 6,255,223 B1 * | 7/2001 | Matsuda et al. ........... 438/716 |
| 6,307,728 B1 * | 10/2001 | Leeser ................... 361/234 |
| 6,898,064 B1 * | 5/2005 | Berman et al. ............ 361/234 |
| 7,292,428 B2 * | 11/2007 | Hanawa et al. ............ 361/234 |
| 7,312,974 B2 * | 12/2007 | Kuchimachi .............. 361/234 |
| 2002/0141133 A1 * | 10/2002 | Anderson et al. .......... 361/234 |
| 2004/0031338 A1 * | 2/2004 | Chen et al. ............... 73/865.9 |
| 2004/0095548 A1 * | 5/2004 | Lim et al. ................ 349/187 |
| 2004/0182311 A1 * | 9/2004 | Hanazaki ................. 118/663 |
| 2008/0087069 A1 * | 4/2008 | Renken et al. ............. 73/1.63 |

OTHER PUBLICATIONS

Kalkowski, G.; Risse S.; Harnisch, G.; Guyenot, V. "Electrostatic chucks for lithography applications." Microelectronic Engineering. 57-58 (2001): 219-222.*

Asano, Kazutoshi, Hatakeyama, Fumikazu, Yatsuzuka, Kyoko. "Fundamental Study of an Electrostatic Chuck for Silicon Wafer Handing." IEEE Transactions on Industry Applications vol. 38 (2002): 840-845.

* cited by examiner

*Primary Examiner*—Lisa M Caputo
*Assistant Examiner*—Punam Roy
(74) *Attorney, Agent, or Firm*—Ked & Associates LLP

(57) ABSTRACT

An apparatus and method for measuring a chuck attachment force are provided. The apparatus is capable of measuring loads applied to a measurement substrate, while the measurement substrate is detached from a chuck, and precisely calculating necessary force through a process of comparing and analyzing values of the measured loads. This may prevent errors in the application of attachment force during a semiconductor manufacturing process. In the semiconductor manufacturing process, when the substrate is detached from a chuck, the substrate may be prevented from being deformed or cracked.

17 Claims, 12 Drawing Sheets

APPARATUS AND METHOD FOR MEASURING CHUCK ATTACHMENT FORCE

CROSS-REFERENCE TO RELATED APPLICATIONS

This application is a Divisional application of prior U.S. patent application Ser. No. 11/872,081 filed Oct. 15, 2007, which claims priority under 35 U.S.C. §119 to Korean Application Nos. 10-2006-0108175, 10-2006-0108176, and 10-2006-0108177 filed on Nov. 3, 2006, whose entire disclosures are hereby incorporated by reference.

BACKGROUND

1. Field

An apparatus and method for measuring chuck attachment force are disclosed herein.

2. Background

Apparatus and method for measuring chuck attachment force are known. However, they suffer from various disadvantages.

BRIEF DESCRIPTION OF THE DRAWINGS

Embodiments will be described in detail with reference to the following drawings in which like reference numerals refer to like elements, and wherein.

DETAILED DESCRIPTION

Figure 1:
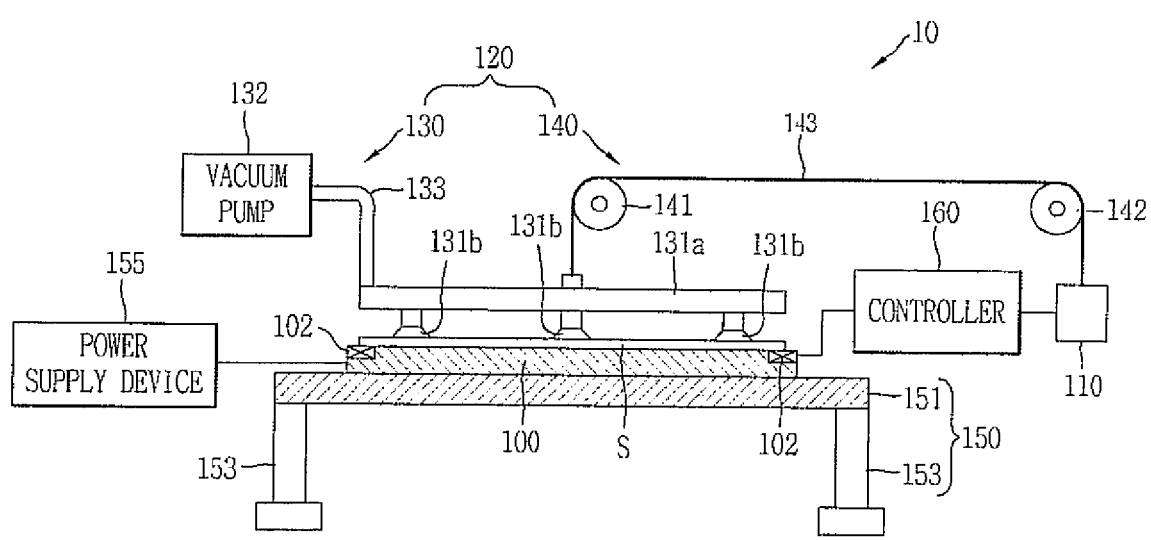
FIG. 1 is a schematic diagram of an apparatus for measuring electrostatic force according to an embodiment.

Embodiments disclosed herein are directed to an apparatus and method for measuring chuck attachment force. Certain embodiments are disclosed employing an electrostatic chuck and measuring electrostatic force. However, the apparatus and method may be utilized with other types of chucks, such as a vacuum chuck, and to measure other types of forces, such as a vacuum force. Further, features of each of the disclosed embodiments may be utilized with any of the other embodiments as desired based on, for example, the desired application.

Generally, in processes of treating substrates, such as semiconductor wafers, thin film transistors (TFTs) used in flat panel displays, glass substrates or similar devices, the substrates, which are carried into chambers, are moved to desired positions, dropped onto support surfaces, and thereafter, are arranged. Recently, according to the integration and lightness of circuits in the semiconductor field, and according to the increase in display area in the field of manufacturing flat panel displays, the significance of a technique of holding substrates to arrange the substrates and drop the substrates at desired positions has been emphasized.

As representative examples of such substrate holding techniques, there are a method using a clamp, a method using vacuum force, and a method using an electrostatic chuck (ESC). In the method using the clamp, a substrate is fixed by clamping an edge of the substrate using the clamp. The clamp may be made of ceramic or other material. In the method using the electrostatic chuck, the electrostatic chuck adsorbs and holds a substrate using electrostatic force generated at contact surfaces between the electrostatic chuck and the substrate.

Recently, of such substrate holding methods, application of the method using the electrostatic chuck, which enhances uniformity of the manufacturing process, has increased. A representative example of related art pertaining to an electrostatic chuck was disclosed in U.S. Pat. No. 6,134,096, entitled "ELECTROSTATIC CHUCK". In this patent, the electrostatic chuck has a structure including an insulation layer, an electrode layer, and a dielectric layer, and is constructed such that a substrate is attached to the electrostatic chuck by applying power of −1000V to +1000V to the electrostatic chuck. In the case of the method of holding the substrate using the electrostatic chuck, because the chuck holds the substrate by adsorbing it using electrostatic force, various operations may be stably conducted during a semiconductor manufacturing process, thus preventing the substrate from being damaged and reducing the defective proportion of products.

The electrostatic chuck for adsorbing and holding the substrate using electrostatic force may include a base plate, which may be made of ceramic, an electrode, which may be provided on the base plate, and a dielectric, which may be supplied with power through the electrode.

In the electrostatic chuck, when power is applied to the electrode to adsorb the substrate, the surfaces of the substrate and the electrode may be polarized. At this time, electrostatic force is generated on the electrostatic chuck, by which the electrostatic chuck adsorbs and holds the substrate.

Recently, according to an increase in the area of flat panel displays, such an electrostatic chuck may include a plurality of dielectrics, which may be provided on a base plate and adsorb a substrate. The plurality of dielectrics, which adsorb and hold the substrate, must ensure even electrostatic force.

Electrostatic force may be set depending on a material and thickness of the substrate. If the dielectrics do not ensure even electrostatic force, an error of electrostatic force may occur, so that, when the substrate is detached from the electrostatic chuck, the substrate may not be correctly detached from the electrostatic chuck, and a sticking phenomenon, in which the substrate may snap back onto the electrostatic chuck, may be induced. Further, the substrate may be deformed or cracked. Therefore, a problem of reduced manufacturing efficiency results.

As shown in FIG. 1, an electrostatic force measuring apparatus 10 according to an embodiment may include an electrostatic chuck 100, onto which a measurement substrate S may be seated, a power supply device 155 that applies voltage to the electrostatic chuck 100, and a separating device 120 that detaches the measurement substrate S from the electrostatic chuck 100 to which voltage is applied. The electrostatic force measuring apparatus 10 may further include a variable load applying device 110, which may be connected to the separating device 120 and operate the separating device 120 through a process of changing a load thereon, and a controller 160 that measures the load of the variable load applying device 110 when the measurement substrate S is attached to the separating device 120 and measures the load of the variable load applying device 110 when the measurement substrate S is detached from the electrostatic chuck 100, thus calculating the electrostatic force using a change in the load of the variable load applying device 110.

The electrostatic chuck 100 absorbs the measurement substrate S using electrostatic force generated by a polarization phenomenon occurring on surfaces between the measurement substrate S and the electrostatic chuck 100 when power is applied thereto. A dummy substrate that meets the same conditions as a thin film transistor and a glass substrate of semiconductor wafer of flat panel display may be used as the measurement substrate S.

In addition, a separate chuck carrying device and a separate substrate carrying device may be provided to move the chuck 100 and the substrate S, although not shown in the drawings.

The electrostatic chuck 100 may be supported by a support device 150. The support device 150 may include a support plate or stage 151 and support legs 153 and may be charged by voltage applied from the power supply device 155. The support plate 151 may serve to hold the electrostatic chuck 100, on which the measurement substrate S is loaded. When voltage is applied from the power supply device 155 to the electrostatic chuck 100, electric charges having a polarity opposite to that of the electric charges applied to the electrostatic chuck 100 may be induced at a contact surface between the electrostatic chuck 100 and the measurement substrate S, so that induced electromotive force may be generated by the induced electric charges, by which the measurement substrate S may be attached to the electrostatic chuck 100.

The electrostatic chuck 100 may have a dielectric ceramic coating layer between it and the measurement substrate S. Depending on a thickness of the dielectric ceramic coating layer, the attaching force with which the measurement substrate S may be chucked to the electrostatic chuck 100 may be changed.

Further, one or more sensor(s) 102 that detect whether the measurement substrate S is attached to or detached from the electrostatic chuck 100 may be provided in the surface of the electrostatic chuck 100 that contacts the measurement substrate S. The sensor(s) 102 may comprise a pressure sensor that detects a change in pressure, or a magnetic sensor that detects a change in the magnetic field between the measurement substrate S and the electrostatic chuck 100.

The power supply device may include a direct current generator (not shown) that supplies direct current to the electrostatic chuck 100. The separating device 120 may include a vacuum device 130 that creates a vacuum to adsorb the measurement substrate S, and a drive device 140 that transmits power to move the vacuum device 130. The vacuum device 130 may include a vacuum suction device 131*a* having vacuum suction members 131*b* that adsorb the measurement substrate S, a vacuum pump 132 that suctions air through the vacuum suction members 131*b*, and a vacuum pipe 133, which may be connected between the vacuum suction members 131*b* and the vacuum pump 132. Vacuum suction pads, which may be made of rubber, or vacuum suction pins, which may be made of a ceramic nonconductor, may be used as the vacuum suction members 131*b* to prevent the vacuum suction member 131*b* from affecting the electrostatic force generated between the measurement substrate S and the electrostatic chuck 100.

The vacuum pump 132 suctions air through the vacuum suction members 131*b* to attach the measurement substrate S to the vacuum suction device 131*a*, such that, when the measurement substrate S is detached from the electrostatic chuck 100, the measurement substrate S, which may be adsorbed by the vacuum suction members 131*b*, may be moved along with the vacuum suction device 131*a* in a vertical direction. As set forth above, the vacuum pipe 133 may serve to connect the vacuum suction device 131*a* and the vacuum pump 132 to each other.

The drive device 140 may include at least one, or, in the example of this embodiment, two pulleys 141 and 142, and a power transmitting member 143, which may be coupled to the pulleys 141 and 142 and the vacuum suction member 131*b* to conduct a power transmitting function. In this embodiment, the pulleys 141 and 142 include a first pulley 141 and a second pulley 142. The first pulley 141 may support the power transmitting member 143, which may be connected to the vacuum suction device 131*a*, such that the power transmitting member 143 may pull the vacuum suction device 131*a* and the measurement substrate S adsorbed and held by the vacuum suction members 131*b* with force corresponding to tension applied to the power transmitting member 143 by the variable load applying device 110.

Further, the second pulley 142 may also serve to support the power transmitting member 143 along with the first pulley 141 such that the force applied from the variable load applying device 110 may be transmitted to the measurement substrate S, attached to the electrostatic chuck 100, through the power transmitting member 143, the direction of which may be changed by the first and second pulleys 141 and 142. A stationary pulley or a movable pulley may be used as each of the first and second pulleys 141 and 142. Further, a plurality of pulleys may be used to change the direction in which force is transmitted.

The power transmitting member 143 may connect the vacuum suction device 131*a*, the first pulley 141, the second pulley 142, and the variable load applying device 110 to each other and transmit force, generated by the variable load applying device 110, to the vacuum suction device 131*a*. A wire rope or a chain, which may be capable of withstanding a load of several tons, may be used as the power transmitting member 143.

In the separating device 120 having the above-mentioned construction, the vacuum device 130 creates a vacuum, thereby adsorbing the measurement substrate S, and the drive device 140 moves the vacuum suction device 131*a*, thus detaching the measurement substrate S from the electrostatic chuck 100.

The variable load applying device 110 adjusts the load thereof in response to an intensity of electrostatic force applied between the measurement substrate S and the electrostatic chuck 100. That is, the force generated in the variable load applying device 110 may be proportional to the intensity of the electrostatic force. The load changing operation of the variable load applying device 110 may be conducted by a method in which one weight may be replaced with another using a separate machine, or by a method in which the load may be increased or reduced using a vertical load cylinder.

The controller 160 may receive, from the sensor(s) 102, information about whether the measurement substrate S is detached from the electrostatic chuck 100. Also, the controller 160 may adjust the load of the variable load applying device 110 until the measurement substrate S is detached from the electrostatic chuck 100, and measure the load of the variable load applying device 110 when the measurement substrate S is detached from the electrostatic chuck 100. In addition, the controller 160 may serve to calculate the electrostatic force using the measured load of the variable load applying device 110.

The operation of the electrostatic force measuring apparatus according to the above-described embodiment, having the above-mentioned construction, will be described herein below.

Figure 2:
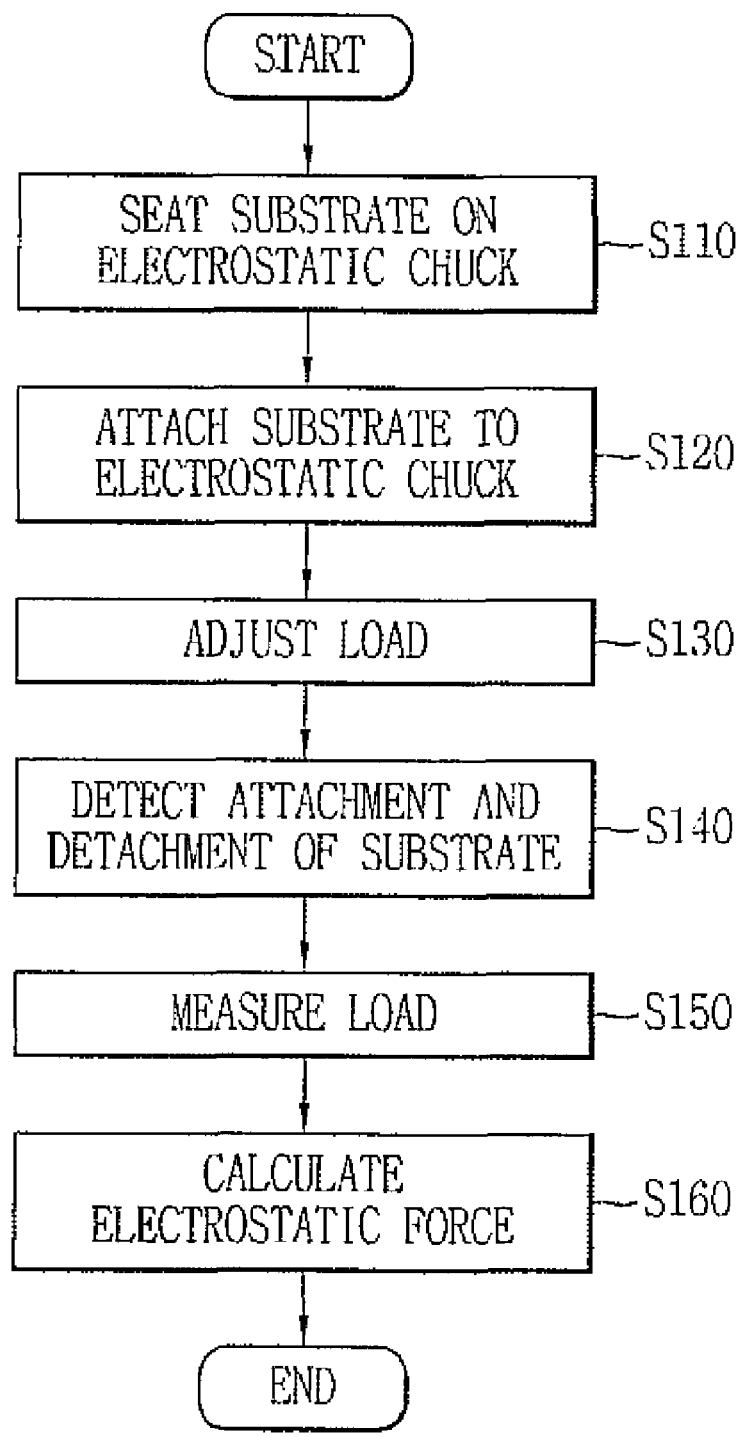
FIG. 2 is a flow chart of a method of measuring electrostatic force according to an embodiment.

As shown in FIG. 2, the measurement substrate S, which may be adsorbed by the vacuum suction members 131b, may be seated on the electrostatic chuck 100, in step S110. Thereafter, when voltage is applied from the power supply device 155 to the electrostatic chuck 100, the electrostatic chuck 100 may be charged, and electrostatic force generated between the measurement substrate S and the electrostatic chuck 100. Then, the measurement substrate S may be attached to the electrostatic chuck 100 by the electrostatic force, in step S120.

After the measurement substrate S has been attached to the electrostatic chuck 100, the controller 160 may gradually increase the load of the variable load applying device 110 until the measurement substrate S is detached from the electrostatic chuck 100, in step S130. Then, the tension of the power transmitting member 143, which may be coupled to the variable load applying device 140, may be gradually increased, and pulling force may be applied to the vacuum suction members 131b. The force by which the vacuum suction members 131b adsorb the measurement substrate S must be greater than the electrostatic force between the electrostatic chuck 100 and the measurement substrate S to make it possible to detach the measurement substrate S from the electrostatic chuck 100.

The load of the variable load applying device 110 may be increased until the measurement substrate S is detached from the electrostatic chuck 100. When the measurement substrate S is detached from the electrostatic chuck 100, the sensor(s) 102, which may be provided in the electrostatic chuck 100, may detect the detachment of the measurement substrate S from the electrostatic chuck 100, in step S140. The detected information of the sensor(s) 102 may be transmitted to the controller 160, so that a load of the variable load applying device 110 when the measurement substrate S is detached from the electrostatic chuck 100 may be determined, in step S150.

Subsequently, the difference between the load of the variable load applying device 110 when the measurement substrate S is attached to the vacuum suction members 131b and the load of the variable load applying device 110 when the measurement substrate S is detached from the electrostatic chuck 100 may be calculated, and the exact value of electrostatic force from this difference value may be determined, in step S160.

In the above-described electrostatic force measuring apparatus and method of measuring electrostatic force, an exact value of electrostatic force may be determined from the difference between the load of the variable load applying device 110 when the measurement substrate S is attached to the vacuum suction members 131b and the load of the variable load applying device 110 when the measurement substrate S is detached from the electrostatic chuck 100, thus preventing an error in the application of electrostatic force in a semiconductor manufacturing process, and preventing a substrate from being cracked or damaged when it is detached from an electrostatic chuck in the semiconductor manufacturing process.

Hereinafter, an apparatus for measuring electrostatic force and a method of measuring electrostatic force according to additional embodiments will be described in detail with reference to FIGS. 3 and 7.

Figure 3:
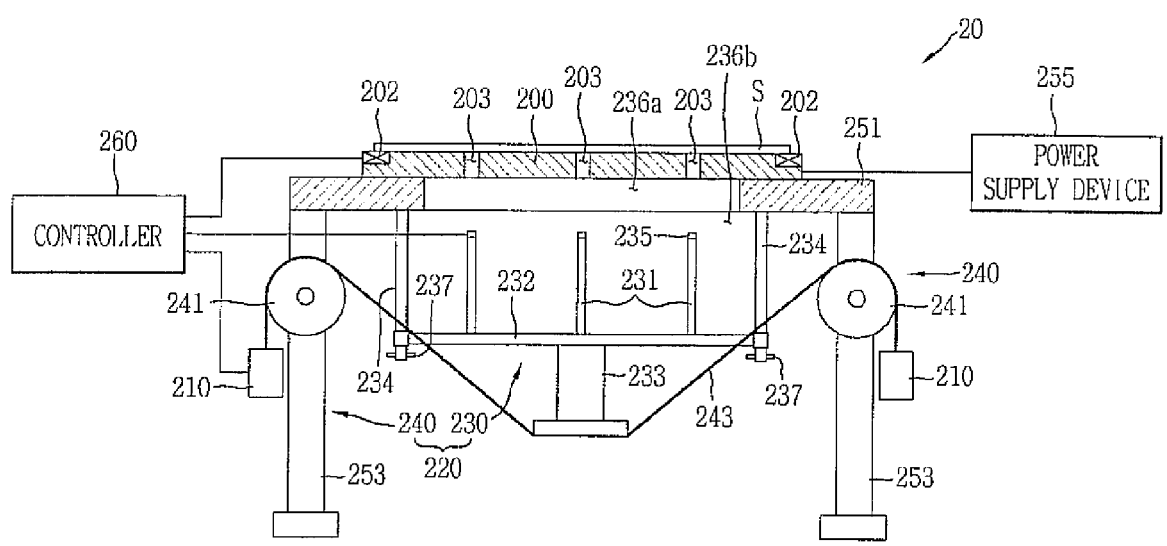
FIG. 3 is a schematic diagram of an apparatus for measuring electrostatic force according to another embodiment.

As shown in FIG. 3, the electrostatic force measuring apparatus 20 according to this embodiment may include an electrostatic chuck 200, onto which a measurement substrate S may be seated, a power supply device 255 that applies voltage to the electrostatic chuck 200, and a separating device 220 that detaches the measurement substrate S from the electrostatic chuck 200 to which voltage is applied. The electrostatic force measuring apparatus 20 may further include variable load applying devices 210, which may be connected to the separating device 220 and operate the separating device 220 through a process of changing a load thereof, and a controller 260 that measures the load of the variable load applying devices 210 when the measurement substrate S is attached to the separating device 220 and measures the load of the variable load applying devices 210 when the measurement substrate S is detached from the electrostatic chuck 200, thus calculating electrostatic force using a change in the load of the variable load applying devices 210.

The electrostatic chuck 200 absorbs the measurement substrate S using electrostatic force generated by a polarization phenomenon occurring on surfaces between the measurement substrate S and the electrostatic chuck 200 when power is applied thereto. A dummy substrate that meets the same conditions as a thin film transistor and a glass substrate of semiconductor wafer of flat panel display may be used as the measurement substrate S. In addition, a separate chuck carrying device and a separate substrate carrying device may be provided to move the chuck 200 and the substrate S, although not shown in the drawings.

The electrostatic chuck 200 may be supported by a support device 250. The support device 250 may include a support plate or stage 251 and support legs 253. A through hole 236a may be formed in the support plate 251, and a plurality of holes 203 may be formed through the electrostatic chuck 200. The electrostatic chuck 200 may be made of ceramic and may have a ceramic coating layer between the measurement substrate S and the electrostatic chuck 200. The ceramic coating layer may provide elasticity when the measurement substrate S is attached to the electrostatic chuck 200, thus increasing attachment ability therebetween.

Further, one or more sensor(s) 202 that detect whether the measurement substrate S is attached to or detached from the electrostatic chuck 200 may be provided in a surface of the electrostatic chuck 200 that contacts the measurement substrate S. When the measurement substrate S is detached from the electrostatic chuck 200, the sensor(s) 202 may detect and transmit a signal(s) to the controller 260. The sensor(s) 202 may include a pressure sensor or a magnetic sensor. The power supply device 255 may include a direct current generator (not shown) that supplies direct current to the electrostatic chuck 200.

The separating device 220 may include a lift device 230 that moves the measurement substrate S upwards, and a drive device 240 that transmits power to operate the lift device 230. The lift device 230 may include a plurality of lift pins 231, which may be brought into contact with the measurement substrate S through the holes 203 formed through the electrostatic chuck 200, a lift plate 232, which may be coupled to the lift pins 231, a lift shaft 233, which may extend from the lift plate 232 to transmit power from the drive device 240 to the lift plate 232, and guide bars 234, which may be provided between the support plate 251 and the lift plate 232 to guide the movement of the lift plate 232.

When voltage is applied from the power supply device 255 to the electrostatic chuck 200, electric charges having a polarity opposite to that of the electric charges applied to the electrostatic chuck 200 are induced on a surface of the measurement substrate S that contacts the electrostatic chuck 200. If the lift pins 231, which may be made of a conductor, are used, when the lift pins 231 contact the measurement substrate S to detach the measurement substrate S from the electrostatic chuck 200, electric charges of the measurement substrate S may be discharged through the lift pins 231, so that the electrostatic force may not be precisely measured. Thus, the lift pins 231 may be nonconductors made, for example, of ceramic material to prevent the discharge of electric charges of the measurement substrate S.

Further, in this embodiment, the measurement substrate S may be detached from the electrostatic chuck 200 by applying a pushing force to the lift pins 231, which may be in a state of contact with the measurement substrate S, so that the attractive force between the electrostatic chuck 100 and the measurement substrate S, that is, the electrostatic force therebetween, may be measured. Therefore, to precisely measure electrostatic force, contact detecting sensors 235, which may detect whether the lift pins 231 are brought into contact with the measurement substrate S, may be provided on ends of the lift pins 231 that contact the measurement substrate S.

The lift plate 232 may serve to transmit force from the drive device 240 to the measurement substrate S and may vertically move along the guide bars 234. That is, the lift pins 231 may transmit force to the measurement substrate S using upward movement of the lift plate 232 such that the measurement substrate S may be detached from the electrostatic chuck 100. The lift pins 231 may be provided on an upper surface of the lift plate 232, and the lift shaft 233 may be coupled at a central portion to a lower surface of the lift plate 232. The lift shaft 233 may serve to transmit the force of the drive device 240 to the lift plate 232 and to maintain a horizontally leveled state of the lift plate 232 along with the guide bars 234.

The guide bars 234 may serve to maintain the lift plate 232 in the horizontally leveled state such that several lift pins 231 may evenly transmit force, which may be applied from the drive device 240 to the lift plate 232, to the measurement substrate S. In addition, the guide bars 234 may serve to define a movement space 236b such that the lift plate 232 may be vertically moved in the movement space 236b. Further, a stop pin 237 may be provided in a lower end of each guide bar 234 to prevent the lift device 230 from being removed from the movement space 236b defined by the guide bars 234.

The drive device 240 may include at least one set of pulleys 241, and power transmitting members 243, which may be connected to the pulleys 241 and the lift shaft 233 to conduct a power transmitting function. The power transmitting members 243 may be coupled at first ends thereof to a lower end of the lift shaft 233. Each power transmitting member 243 may be coupled at a second end thereof to the corresponding variable load applying device 210. The upper end of the lift shaft 233 may be coupled to the central portion of the lift plate 232.

A stationary pulley may be used, for example, as each pulley 241, and a wire rope or a chain, which is capable of withstanding a load of several tons, may be used as each power transmitting member 243.

Figure 4:
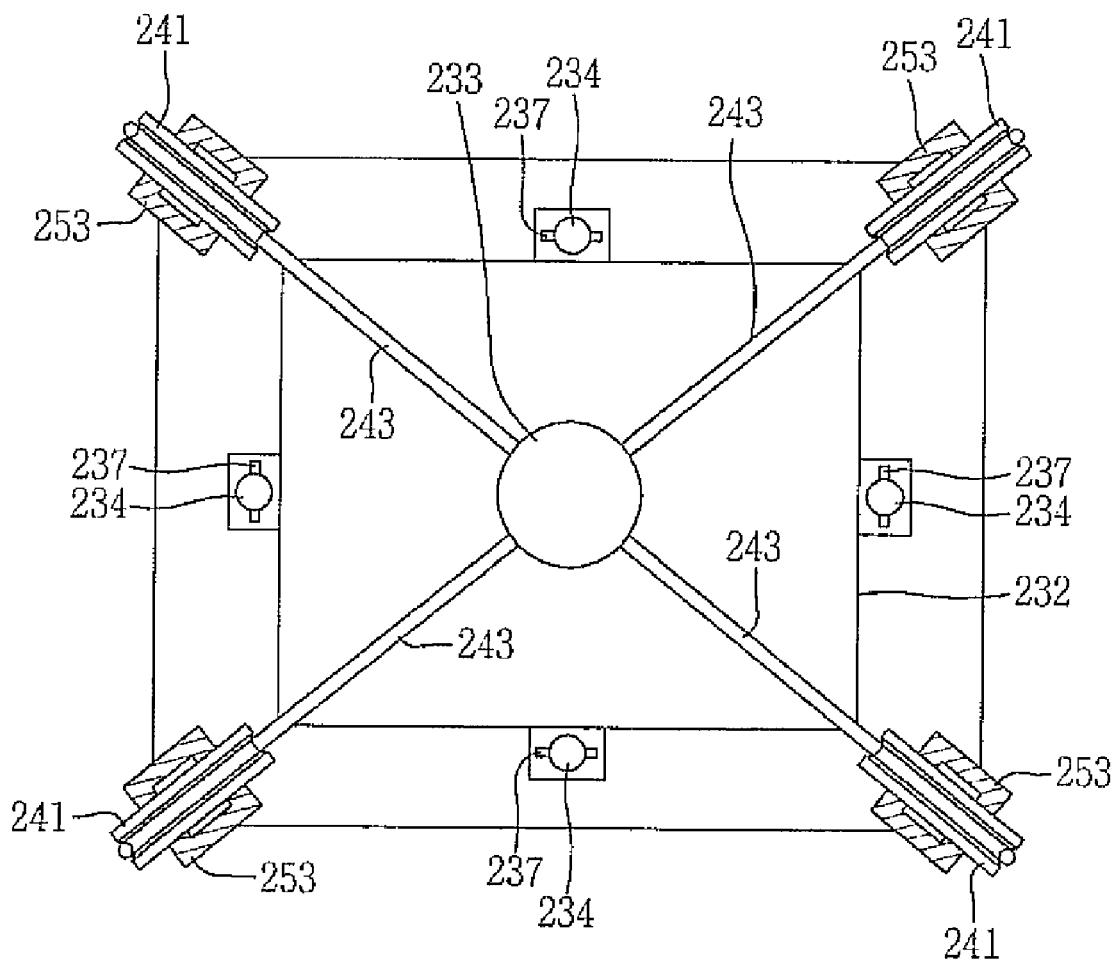
FIG. 4 is a bottom view of the electrostatic force measuring apparatus of FIG. 3.

As shown in FIG. 4, in this embodiment, four power transmitting members 243, each of which may be connected to the lift shaft 233, may be oriented in four respective directions and may be wrapped around the respective pulleys 241, which may be provided on four respective support legs 253. Further, the four pulleys 241 may be installed to maintain balance of the lift device 230 and to disperse the force that is applied to the lift device 230.

In the case of four pulleys 241, if the loads generated in the variable load applying devices 210 are equal to each other, the force applied to the lift device 230 is four times as much as the force applied to each pulley 241. Further, even if the loads generated in the variable load applying devices 210 differ from each other, the force applied to the lift device 230 is equal to the sum of the loads generated in the variable load applying devices 210.

The loads of the variable load applying devices 210 may be controlled by the controller 260. The vertical position of the lift device 230 may be changed depending on the change in the load of the variable load applying devices 210.

When the load of the variable load applying devices 210, which may be connected to respective power transmitting members 243, is increased, an upward moving force may be transmitted to the lift plate 232, coupled to the lift shaft 233. Thereby, the lift plate 232 may be moved upwards. Here, as a modification of the method of vertically moving the lift plate 232, a lift cylinder may be used. Further, the load changing operation of each variable load applying device 210 may be conducted using counterbalances or using a vertical load cylinder.

The controller 260 may receive information about whether the lift pins 231 have been brought into contact with the measurement substrate S, measure the load of the variable load applying devices 210 when the lift pins 231 have been brought into contact with the measurement substrate S, and increase the load of the variable load applying devices 210 until the measurement substrate S is detached from the electrostatic chuck 200. Thereafter, the controller 260 may measure the load of the variable load applying devices 210 when it detects the detachment of the measurement substrate S from the electrostatic chuck 200 using the sensor(s) 202.

Figure 5:
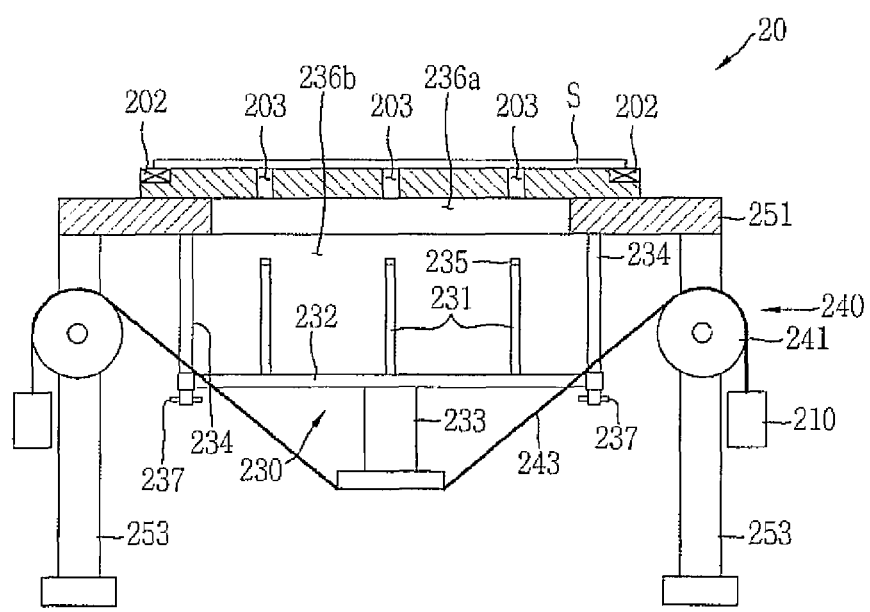
FIGS. 5 and 6 are views illustrating operation of the electrostatic force measuring apparatus of FIG. 3.

Meanwhile, as shown in FIG. 5, in the drive device 240, which uses the pulleys 241, when the load of the variable load applying devices 210 connected to the first ends of the respective power transmitting members 243 is increased, the tension of the power transmitting member 243 increases, and thus pulls the lift shaft 233. Thereby, the lift plate 232 may be moved upwards.

Figure 6:
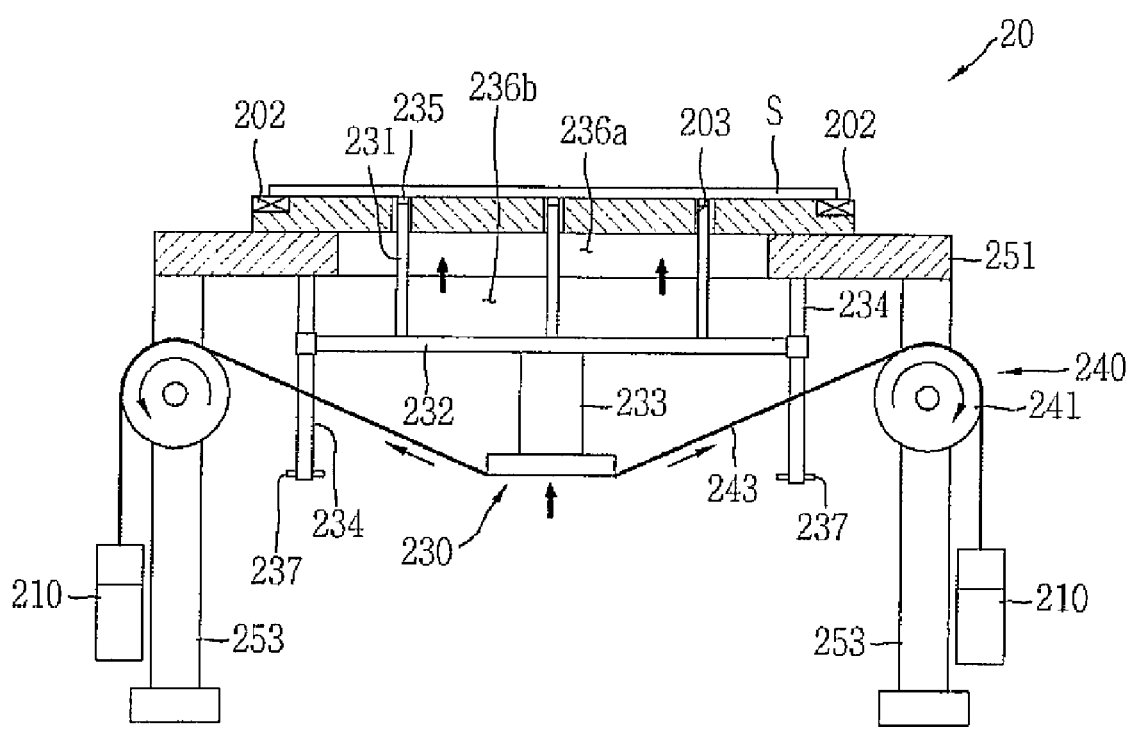

However, if a distance between the measurement substrate S and the lift device 230 is relatively large, when detaching the measurement substrate S from the electrostatic chuck 200, because the force required for moving the lift device 230 to the measurement substrate S may also be included in the calculation of the load of the variable load applying devices 210, it is difficult to precisely measure electrostatic force. Therefore, as shown in FIG. 6, when the lift pins 231 are moved to the contact surface of the measurement substrate S, the load of the lift device 230 may be measured, and when the measurement substrate S is detached from the electrostatic chuck 200, the load of the lift device 230 may be measured. Thereafter, electrostatic force may be calculated using the difference between the loads. Then, the electrostatic force may be measured more precisely.

The operation of the electrostatic force measuring apparatus according to this embodiment, having the above-mentioned construction, will be described herein below.

Figure 7:
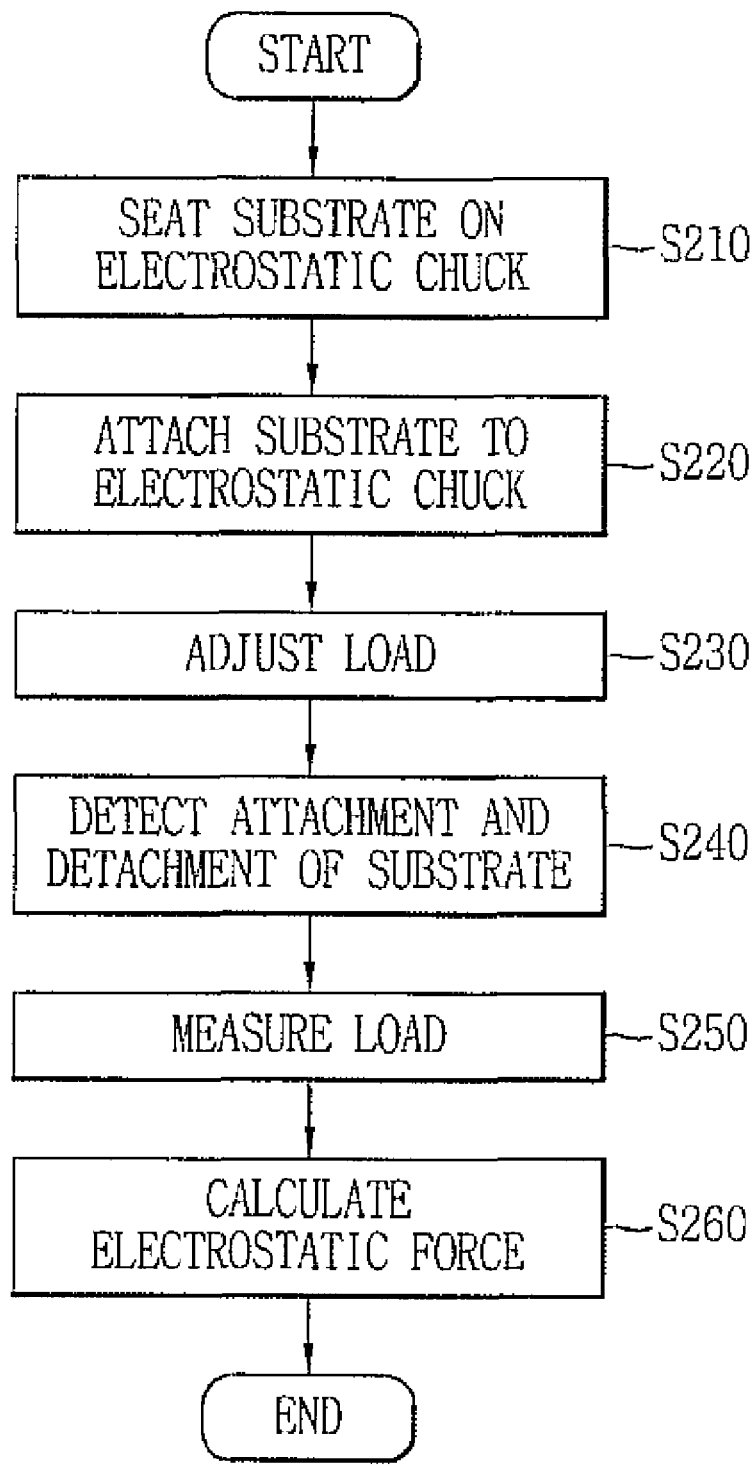
FIG. 7 is a flow chart of a method of measuring electrostatic force according to another embodiment.

As shown in FIG. 7, the measurement substrate S may be seated on the electrostatic chuck 200, in step S210. Thereafter, when voltage is applied from the power supply device 255 to the electrostatic chuck 200, the electrostatic chuck 200 may be charged, and electrostatic force generated between the measurement substrate S and the electrostatic chuck 200. Then, the measurement substrate S may be attached to the electrostatic chuck 200 by the electrostatic force, in step S220.

After the measurement substrate S has been attached to the electrostatic chuck 200, the controller 260 may gradually increase the load of the variable load applying devices 210. Then, the tension of the power transmitting members 243 connected to the respective variable load applying devices 210 may be gradually increased, so that the lift shaft 233 may be pulled, by which the lift device 230 may be slowly moved upwards.

To reduce an error in the measurement of the electrostatic force, the lift device 230 may be first moved upwards until the lift pins 231 are brought into contact with the measurement substrate S. When the lift pins 231 are brought into contact with the measurement substrate S, the contact detecting sensors 235, which may be provided in the lift pins 231, may detect the contact therebetween. At this time, the controller 260 may measure the load of the variable load applying devices 210, in step S230. In the case where each variable load applying device 210 uses a method in which a load is varied by replacing a counterbalance with another, the load may be a value resulting from multiplying the weights of the counterbalances by the acceleration of gravity. This value may be equal to the force applied to the lift device 230.

The load of the variable load applying devices 210 may be gradually increased. Then, the lift device 230 may be moved further upwards. Ultimately, the measurement substrate S is detached from the electrostatic chuck 200. As such, when the measurement substrate S is detached from the electrostatic chuck 200, the sensor(s) 202 installed in the electrostatic chuck 200 may detect such detachment, in step S240. The detected information of the sensor(s) 202 may be transmitted to the controller 260, and the controller 260 may measure the load of the variable load applying devices 210 when the measurement substrate S is detached from the electrostatic chuck 200, in step S250.

Thereafter, electrostatic force may be precisely calculated using the difference between the load of the variable load applying devices 210 when the measurement substrate S is detached from the electrostatic chuck 200 and the load of the variable load applying devices 210 when the lift pins 235 are brought into contact with the measurement substrate S, in step S260.

In the above-described electrostatic force measuring apparatus and method of measuring electrostatic force, the exact value of electrostatic force may be determined from the difference between the load of the variable load applying devices 210 when the lift pins 235 are brought into contact with the measurement substrate S and the load of the variable load applying devices 210 when the measurement substrate S is detached from the electrostatic chuck 200, thus preventing an error in the application of electrostatic force in a semiconductor manufacturing process, and preventing a substrate from being cracked or damaged when it is detached from an electrostatic chuck in the semiconductor manufacturing process.

Hereinafter, an apparatus for measuring electrostatic force and a method of measuring electrostatic force according to additional embodiments will be described in detail with reference to FIGS. 8 and 12.

Figure 8:
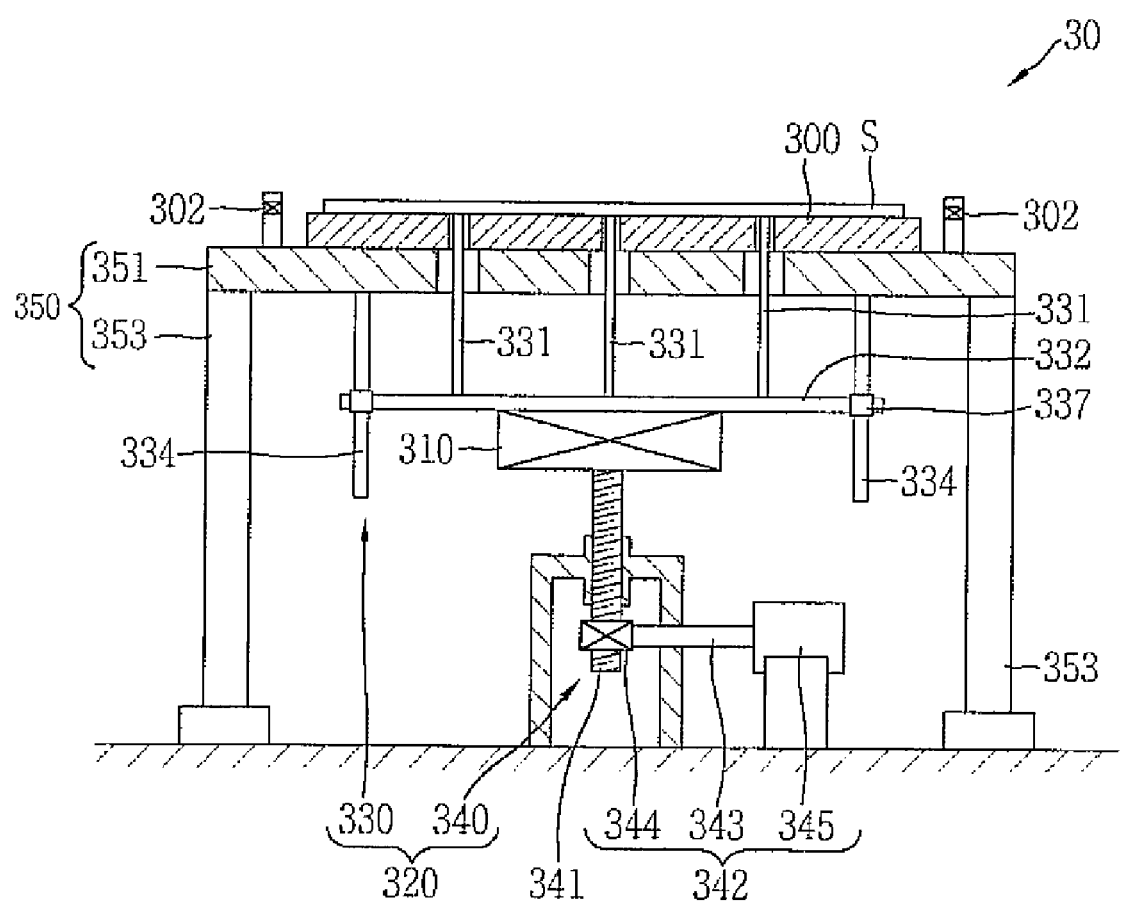
FIG. 8 is a schematic diagram of an apparatus for measuring electrostatic force according to another embodiment.

As shown in FIG. 8, the electrostatic force measuring apparatus 30 according to this embodiment may include an electrostatic chuck 300, onto which a measurement substrate S may be seated, and a separating device 320 that detaches the measurement substrate S from the electrostatic chuck 300. The electrostatic force measuring apparatus 30 may further include a load measuring apparatus 310 that measures the load when the separating device 320 is brought into contact with the measurement substrate S and measures the load when the measurement substrate S is detached from the electrostatic chuck 300.

The electrostatic chuck 300 may be supported by a support device 350. The support device 350 may include a stage 351, onto which the electrostatic chuck 300 may be placed, and support frames 353, which may be provided under a perimeter of a lower surface of the stage 351 to support the stage 351.

The electrostatic chuck 300 adsorbs the measurement substrate S using electrostatic force generated by a polarization phenomenon occurring on surfaces between the measurement substrate S and the electrostatic chuck 300 when power is applied thereto. A dummy substrate that meets the same conditions as a thin film transistor and a glass substrate of a semiconductor wafer or a flat panel display may be used as the measurement substrate S. In addition, a separate chuck carrying device and a separate substrate carrying device may be provided to move the electrostatic chuck 300 and the substrate S, although not shown in the drawings.

In detail, the electrostatic chuck 300 may be placed on an upper surface of the stage 351. An electrode (not shown) for applying power to the electrostatic chuck 300 may be provided in the stage 351.

The separating device 320 may include a lift device 330, which may be disposed below the stage 351 and push the substrate S to detach it from the electrostatic chuck 300, and a drive device 340 that vertically moves the lift device 330. The lift device 330 may include a plurality of lift pins 331, which may be vertically moved through the stage 351 and the electrostatic chuck 300, a lift plate 332 that supports the lift pins 331, and guide bars 334, which may be provided between the support device 350 and the lift plate 332 to guide the movement of the lift plate 332.

Here, the lift pins 331 and the lift plate 332 may be vertically moved under guidance of the guide bars 334 in a state in which the lift plate 332 is parallel to the substrate S attached to the electrostatic chuck 300. Thus, the lift pins 331, which may be supported by the lift plate 332, may evenly contact the substrate S, attached to the electrostatic chuck 300. Therefore, a measurement error by the load measuring device 310 measuring a load may be reduced.

At least two guide bars 334 may be provided at respective opposite positions under the perimeter of the stage 351. Further, a coupler 337, which is vertically movable along the corresponding guide bar 334, may be provided on each lift plate 332. Alternatively, through holes (not shown) may be formed through the lift plate 332 such that the lift plate 332 may be vertically movable along the guide bars 334 through the through holes.

Meanwhile, one or more sensor(s) 302 may be provided in the stage 351 to detect whether the substrate S is placed on the electrostatic chuck 300 and whether the lift pins 331 are brought into contact with the substrate S. The sensor(s) 302 may be connected to the load measuring apparatus 310 to transmit information about placement of the substrate S and contact between the lift pins 331 and the substrate S to the load measuring device 310.

In detail, when the substrate S is placed on the electrostatic chuck 300, the sensor(s) 302 may transmit information about the placement of the substrate S to the load measuring device 310. The load measuring apparatus 310 may measure a first load W1, which may be the load of the lift device 330 before it pushes the substrate S. Further, when the lift pins 331 are brought into contact with the substrate S, the sensor(s) 302 may transmit information about the contact between the lift pins 331 and the substrate S to the load measuring apparatus 310. The load measuring device 310 may measure a second load W2, which may be the load of the lift device 330 when the substrate S is detached from the chuck 300.

Here, as shown in FIG. 8, the sensor(s) 302 may comprise a pair of optical sensors, which may face each other and be located on opposite sides of the measurement substrates. Alternatively, a pressure sensor or a magnetic sensor, which may be installed in an upper surface of the chuck 300, on which the measurement substrates is seated, may be used as the sensor(s) 302, although not shown in the drawings.

The drive device 340 may include a lift screw 341, which may move vertically, and a power generating and transmitting device 342, which may be coupled to the lift screw 341 and supply power to vertically move the lift screw 341. The lift screw 341 may be provided below the lift device 330 and may be constructed such that the lift plate 332 and the lift pins 331, which may be supported on the lift plate 332, may be vertically moved together with the vertical movement of the lift screw 341.

The power generating and transmitting device 342 may include a power transmitting screw 343, which may have a rotating shaft oriented in a direction perpendicular to the lift screw 341, a bevel gear 344, which may be provided in a junction between the lift screw 341 and the power transmitting screw 343, and a power source 345, which may rotate the power transmitting screw 343.

The power source 345 may be in the form of a manual handle so that power may be supplied by rotating the handle using the manual power of a user. Alternatively, a mechanical power source, such as a drive motor, may be used to supply power.

The load measuring apparatus 310 may be disposed between the lift device 330 and the drive device 340. The upper surface of the load measuring apparatus 310 may be in contact with the lower surface of the lift plate 332, and the lower surface thereof may be coupled to the lift screw 341.

Figure 9:
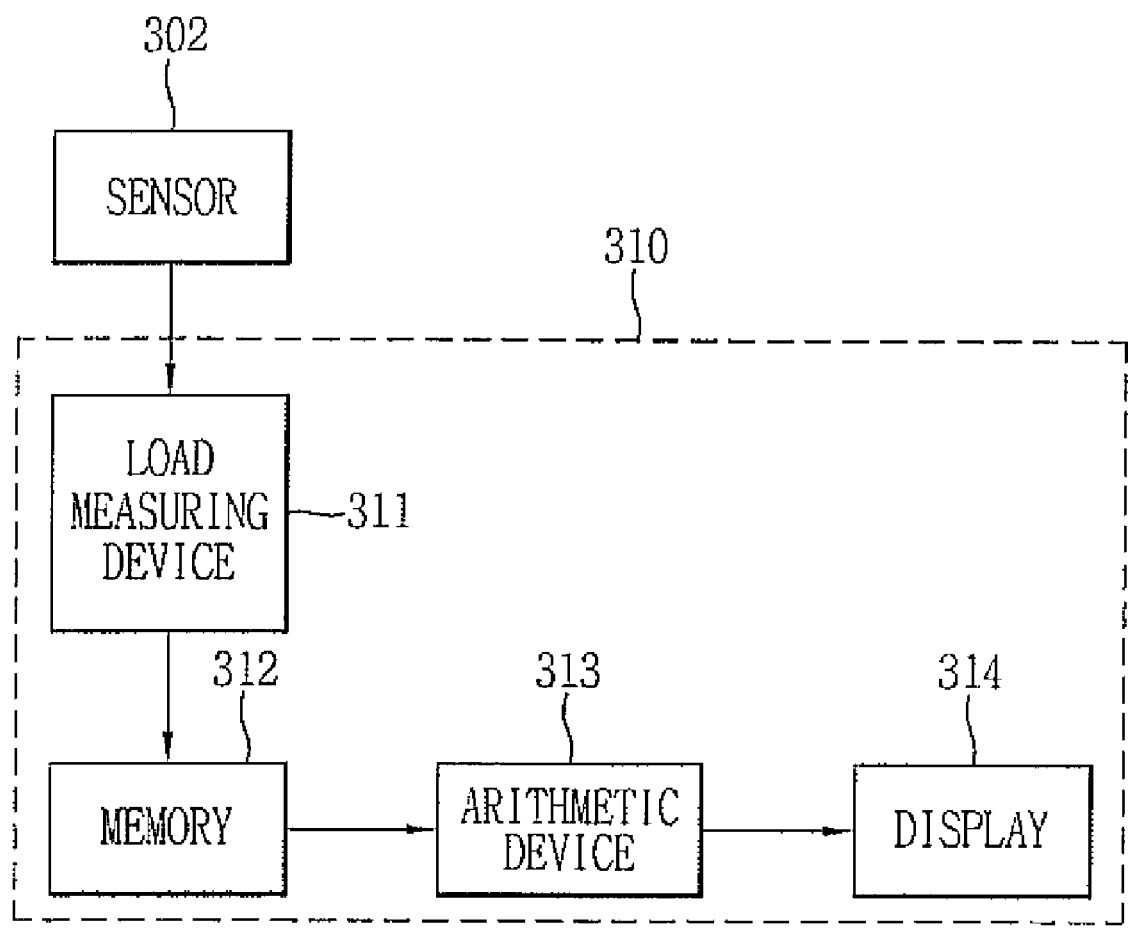
FIG. 9 is a block diagram of a load measuring device of FIG. 8.

As shown in FIG. 9, the load measuring apparatus 310 may include a load measuring device 311 that measures the first load W1 and the second load W2, a memory 312 that stores the first load value W1 and the second load value W2, an arithmetic device 313 that calculates a difference value between the first load value W1 and the second load value W2, which may be stored in the memory 312, and a display 314 that displays the difference value.

Here, a typical electron scale may be used as the load measuring device 311. Alternatively, a piezoelectric sensor, which uses the phenomenon in which, when mechanical force is applied to a substance made of material such as ceramic, an internal stress is generated and electric polarization is induced in the substance, may be used as the load measuring device 311.

When the lift screw 341 is moved upwards to detach the substrate S from the electrostatic chuck 300, the pressure of the lift screw 341 may be transmitted to the load measuring apparatus 310. Then, the load measuring apparatus 310 moves the lift plate 332 upwards using the pressure of the lift screw 341, by which the lift pins 331, which may be supported on the lift plate 332, may be moved upwards.

During this process, the load measuring device 311 measures both the pressure of the lift screw 341 that is applied to the lift device 330 before the substrate S, attached to the chuck 300, is pushed by the lift pins 331, and the pressure of the lift screw 341 that is applied to the lift device 330 when the substrate S is detached from the chuck 300. In other words, the load measuring device 311 measures both a first load W1, which is the load of the lift device 330 before it pushes the substrate S attached to the chuck 300, and a second load W2, which is the load of the lift device 330 when the substrate S is detached from the chuck 300.

The operation of the electrostatic force measuring apparatus according to this embodiment, having the above-mentioned construction will be described herein below.

Figure 10:
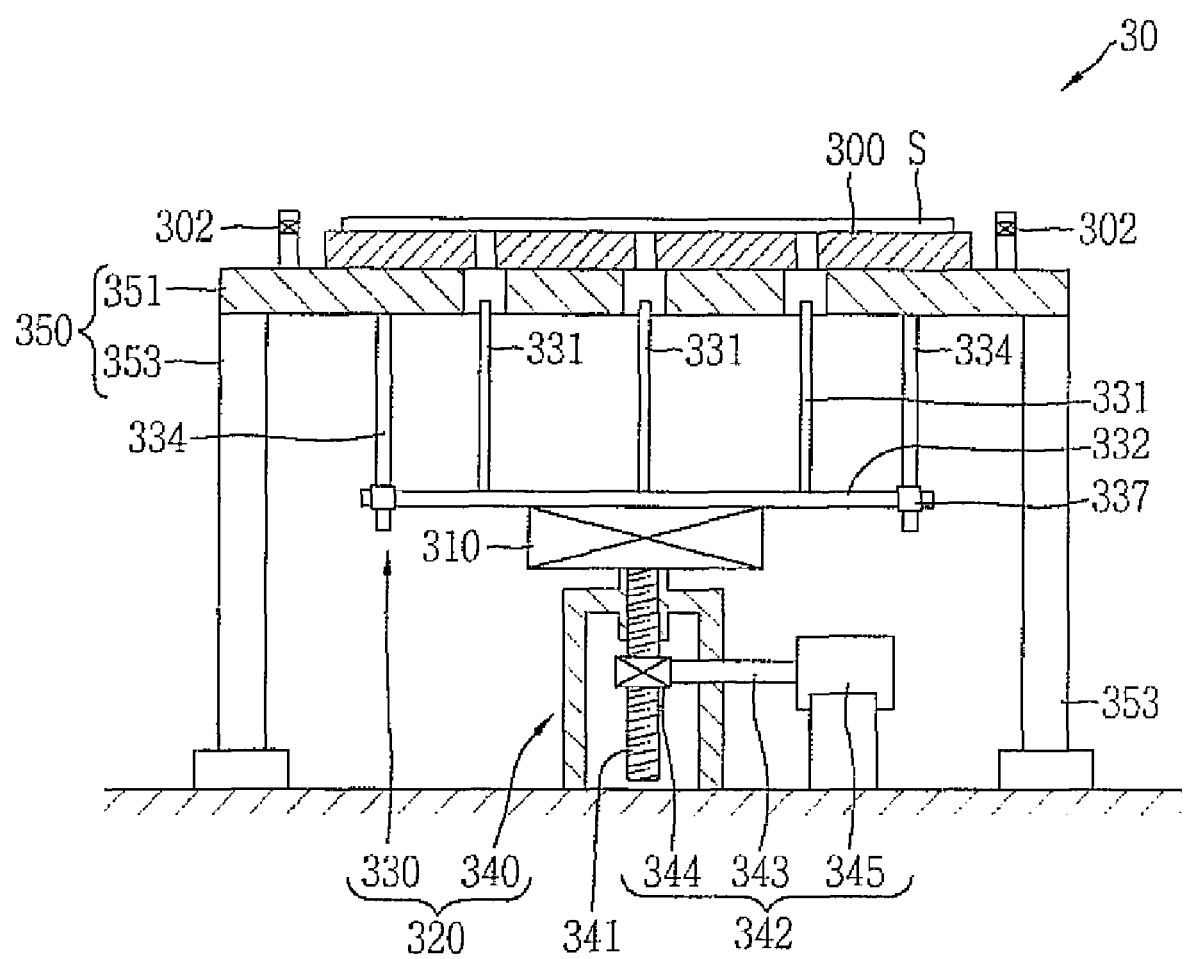
FIGS. 10 and 11 are views illustrating operation of the electrostatic force measuring apparatus of FIG. 8.
Figure 11:
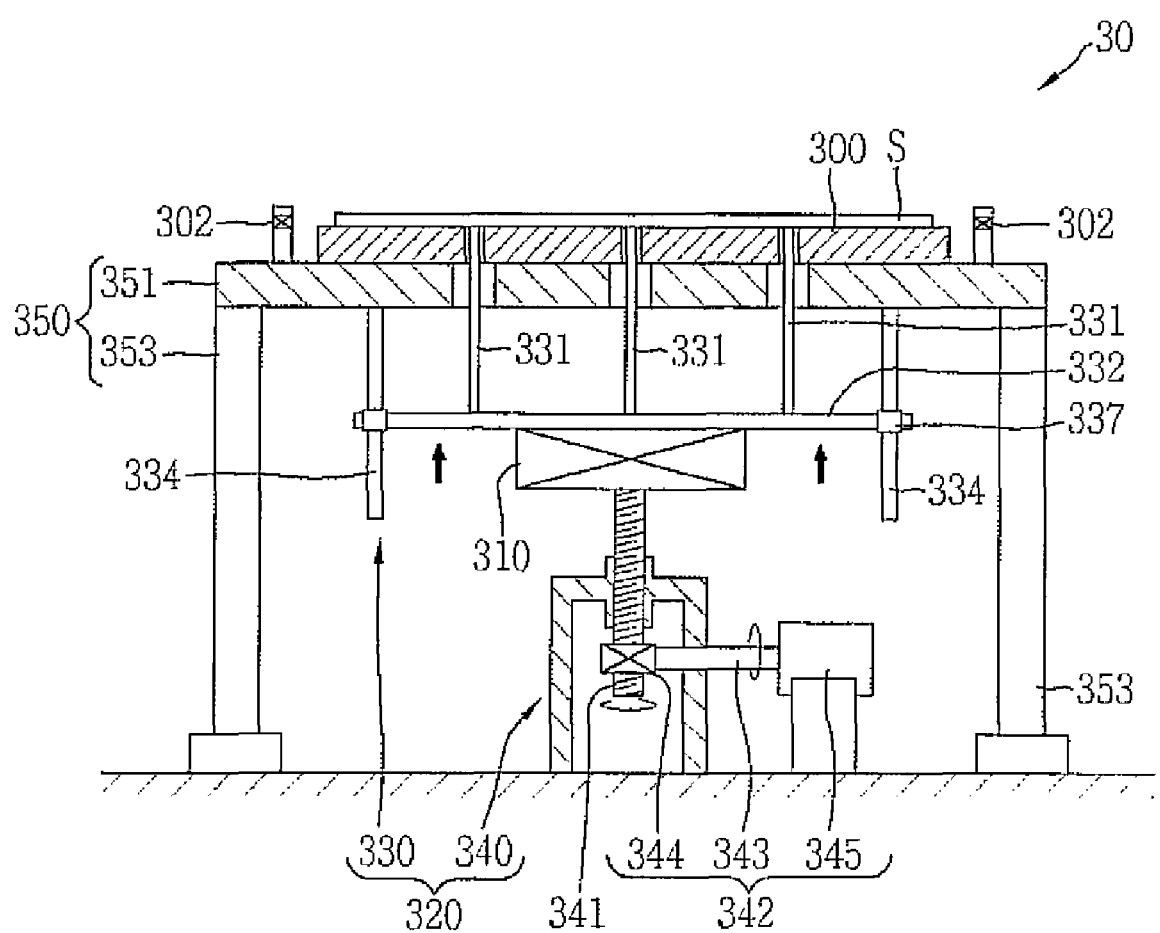
Figure 12:
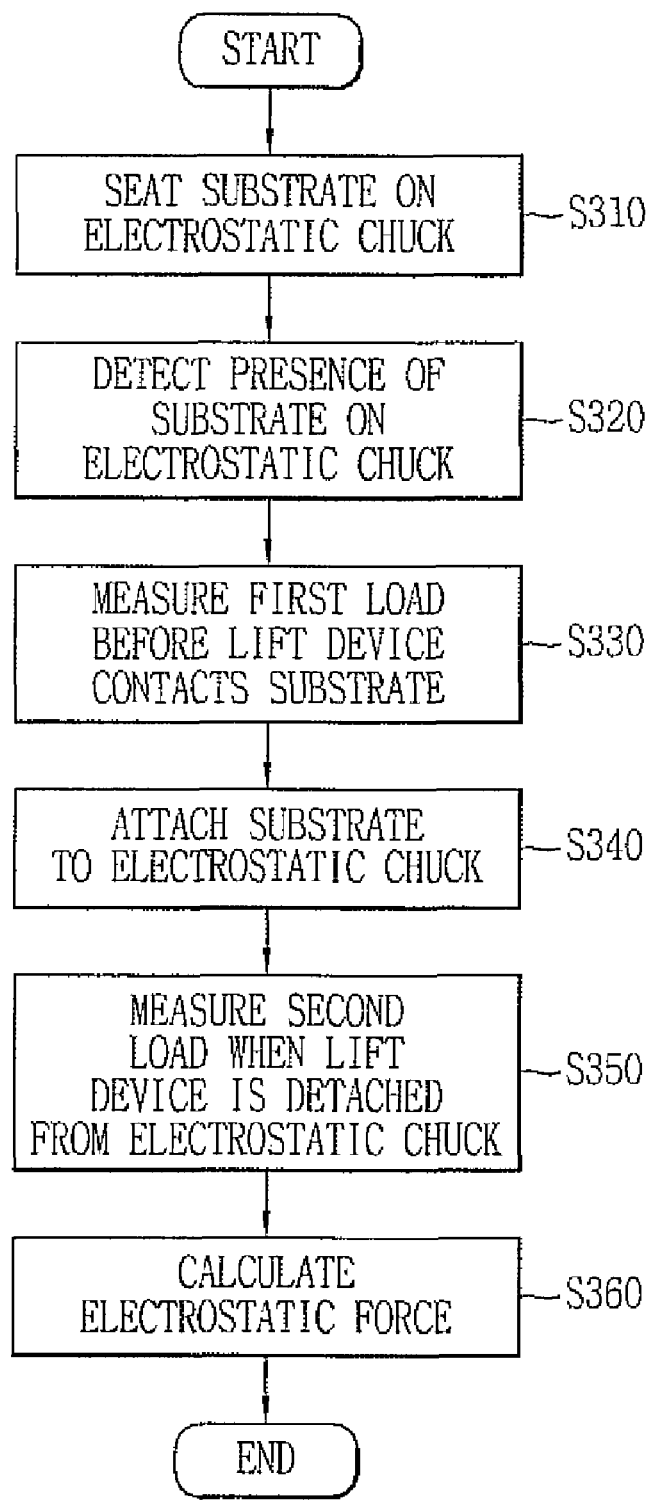
FIG. 12 is a flow chart of a method of measuring electrostatic force according to another embodiment.

As shown in FIGS. 10 through 12, the electrostatic chuck 300 may be first placed on the stage 351 of the support device 350, and the substrate S may be seated on the upper surface of the electrostatic chuck 300, in step S310. As such, when the electrostatic chuck 300 is placed on the stage 351 of the support device 350 and the substrate S is seated on the electrostatic chuck 300, the sensor(s) 302 may detect the presence of the substrate S, in step S320, and transmit this to the load measuring apparatus 310. At this time, the load measuring device 311 of the load measuring apparatus 310 may measure a first load W1, which may be the load of the lift device 330 before the substrate attached to the electrostatic chuck 300 is pushed by the lift device 330, and store the measured value in the memory 312, in step S340.

Thereafter, power may be supplied to the electrode (not shown) of the stage 351 to generate electrostatic force between the substrate S and the electrostatic chuck 300, in step S340. The power, which may be supplied to the electrode of the stage 351, may be applied to the electrostatic chuck 300. At this time, an electric polarization phenomenon may be induced in the surfaces between the electrostatic chuck 300 and the substrate S. The electrostatic chuck 300 may adsorb the substrate S using the electrostatic force generated by the electric polarization.

After the substrate S is attached to the electrostatic chuck 300 by electrostatic force, the power generating and transmitting device 342 of the drive device 340 may rotate the lift screw 341 to move the lift screw 341 upwards. While the lift screw 341 is gradually moved upwards, the load measuring apparatus 310, which may be coupled to the lower surface of the lift plate 332 of the lift device 330, may transmit the pressure of the lift screw 341 to the lift plate 332.

The lift plate 332, which may receive the pressure of the lift screw 341 through the load measuring apparatus 310, may move upwards under the guidance of the guide bars 334 in a state in which it is parallel to the substrate S, and thus, move the lift pins 331 upwards. Then, the lift pins 331 may pass through the stage 351 and the chuck 300 and come into contact with the substrate S.

At this time, the sensor(s) 302 may detect the contact between the lift pins 331 and the substrate S and transmit this to the load measuring apparatus 310. Subsequently, the load measuring device 311 of the load measuring apparatus 310 may measure a second load W2, which may be the load of the lift device 330 when the substrate S is detached from the chuck 300, and store the measured value in the memory 312, in step S350.

Before the substrate S is detached from the electrostatic chuck 300, because the substrate S maintains the state in which it is attached to the electrostatic chuck 300 by adsorbing force, electrostatic force is applied in a direction opposite the direction in which the lift pins 331 are moved upwards. Therefore, the second load W2 is the load of the lift device 330, including the load resulting from electrostatic force.

Further, the first load W1 and the second load W2 respectively correspond to the pressure of the lift screw 341 which is applied to the lift device 330 before the lift device 330 pushes the substrate S attached to the chuck 300, and the pressure of the lift screw 341 which is applied to the lift device 330 in the state in which electrostatic force is applied between the substrate S and the chuck 300.

Therefore, the electrostatic force may be calculated using the following equation.

$$P = W2 - W1$$

Here, P denotes the electrostatic force of the electrostatic chuck 300, W1 denotes a first load, which may be the load of the lift device 330 before it pushes the substrate S attached to the electrostatic chuck 300, and W2 denotes a second load, which may be the load of the lift device 330 when the substrate S is detached from the electrostatic chuck 300.

Thereafter, the arithmetic device 313 of the load measuring apparatus 310 may calculate the difference between the first load W1 and the second load W2 and determine the electrostatic force P of the chuck 300, in step S360. The display 314 may display the electrostatic force P.

In the electrostatic force measuring method according to this embodiment, the electrostatic force P required for attaching a substrate to an electrostatic chuck may be precisely measured, so that the electrostatic force P may be evenly applied to the electrostatic chuck in a semiconductor manufacturing process. As such, in the electrostatic force measuring apparatus according to this embodiment and the method of measuring electrostatic force, an exact value of electrostatic force may be determined from the difference between the first load of the lift device 330 before it contacts the substrate S, attached to the electrostatic chuck 300, and the second load of the lift device 330 when the substrate S is detached from the electrostatic chuck 300. Therefore, the exact value of electrostatic force may be applied to an electrostatic chuck in a semiconductor manufacturing process, thus preventing a substrate from being cracked or damaged in the semiconductor manufacturing process, and enhancing the efficiency of the semiconductor manufacturing process.

As described above, in an apparatus for measuring electrostatic force and a method of measuring electrostatic force using the apparatus according to embodiments disclosed herein, electrostatic force may be precisely measured, such that whether the measured electrostatic force value is a value appropriate for conducting a semiconductor manufacturing process may be determined. Therefore, an error in applying electrostatic force during the semiconductor manufacturing process may be prevented, so that, when the substrate is detached from an electrostatic chuck in the semiconductor manufacturing process, the substrate may be prevented from being deformed or cracked.

Embodiments disclosed herein provide an apparatus and method for measuring electrostatic force through the calculation of force applied to a substrate when the substrate is released from electrostatic force, preventing the occurrence of an error in the determination of electrostatic force in a semiconductor manufacturing process, preventing the substrate from being damaged.

An embodiment disclosed herein provides an apparatus for measuring electrostatic force that includes a power supply unit or device that applies a voltage to an electrostatic chuck, a separating unit or devices that detaches a substrate, which is attached to the electrostatic chuck supplied with the voltage, from the electrostatic chuck, a variable load applying unit or device connected to the separating unit, the variable load applying unit operating the separating unit by changing a load of the variable load applying unit, and a control unit or device that measures both a load of the variable load applying unit, when the substrate is attached to the separating unit, and a load of the variable load applying unit, when the measurement substrate is detached from the electrostatic chuck, and to calculate electrostatic force. The separating unit may include a vacuum unit or device that creates a vacuum to adsorb the measurement substrate, and a drive unit or device that transmits power to move the vacuum unit.

Further, the vacuum unit may include a vacuum suction member to adsorb the substrate, and a vacuum pump to draw air through the vacuum suction member. The vacuum suction member may comprise one selected from a vacuum suction pad and a vacuum suction pin.

The apparatus may further include a sensing unit or device provided in the electrostatic chuck to detect whether the substrate is attached to or detached from the electrostatic chuck. The sensing unit may comprise one selected from a pressure sensor or a magnetic sensor. The separating unit may include a lift unit or device that detaches the measurement substrate, which may be attached to the electrostatic chuck, from the electrostatic chuck, and a drive unit or device that transmits drive force to move the lift unit.

In addition, the lift unit may include a lift pin to contact the substrate to transmit the force, applied from the drive unit, to the substrate. A contact detecting sensor may be provided in a part of the lift pin that contacts the substrate to detect whether the lift pin contacts the substrate. The drive unit may include a power transmitting member, which may connect the variable load applying unit to the lift unit to transmit the drive force to the lift unit.

Another embodiment disclosed herein provides an apparatus for measuring electrostatic force that includes a chuck to seat a substrate thereon, a separating unit or device comprising a lift unit or device that detaches a substrate from the electrostatic chuck and a drive unit or device that operates the lift unit, and a load measuring device that measures a first load of the lift unit before the separating unit compresses the substrate and measures a second load of the lift unit when the substrate is detached from the chuck, the load measuring device calculating an electrostatic force of the chuck using a difference value between the first load and the second load. The apparatus may further include a support unit or device that supports the chuck, and may have a stage onto which the chuck is placed, and a support frame to support the stage.

The lift unit may include a plurality of lift pins to vertically move through the chuck and a lift plate supporting the lift pins. A sensor may be provided in the support unit to detect whether the substrate is attached to or detached from the chuck and whether the lift pins come into contact with the substrate.

In addition, a guide bar may be provided on the stage such that the lift plate may be slidably coupled to the guide bar, thus guiding vertical movement of the lift unit. The drive unit may include a lift screw supporting the lift plate, the lift screw being vertically moved, and a power generating and transmitting unit or device that rotates the lift screw.

The load measuring device may include a load measuring unit or device that measures the first load and the second load, a memory unit or device that stores the first load value and the second load value therein, an arithmetic unit or device that calculates a difference value between the first load value and the second load value, which may be stored in the memory unit, and a display unit or device that displays the difference value.

Further, another embodiment disclosed herein provides a method of measuring electrostatic force that includes placing a substrate onto an electrostatic chuck, applying a voltage to the electrostatic chuck to charge the electrostatic chuck and attaching the substrate to the electrostatic chuck using electrostatic force generated by the voltage, moving a vacuum unit or device upwards by changing a load of a variable load applying unit or device that detaches the substrate from the electrostatic chuck, measuring a load of the variable load applying unit when the substrate is detached from the electrostatic chuck by the variable load applying unit, and calculating a difference value between the load of the variable load applying unit, measured when the substrate is detached from the electrostatic chuck, and a load of the variable load applying unit, measured when a vacuum unit or device adsorbs and holds the substrate, and determining an electrostatic force using the difference value.

Another embodiment disclosed herein provides a method of measuring electrostatic force that includes placing a substrate onto an electrostatic chuck, applying a voltage to the electrostatic chuck to charge the electrostatic chuck and attaching the substrate to the electrostatic chuck using an electrostatic force generated by the voltage, moving a lift unit or device upwards to detach the substrate from the electrostatic chuck and measuring a load of a variable load applying unit or device when the lift unit comes into contact with the substrate, measuring a load of the variable load applying unit when the substrate is detached from the electrostatic chuck by the upward movement of the lift unit, and calculating a difference value between the load of the variable load applying unit, measured when the lift unit comes into contact with the substrate, and the load of the variable load applying unit, measured when the substrate is detached from the electrostatic chuck, and determining an electrostatic force using the difference value.

Another embodiment disclosed herein provides a method of measuring electrostatic force that includes measuring a first load of a lift unit or device before the lift unit compresses a substrate attached to a chuck, and measuring a second load of the lift unit when the substrate is detached from the chuck.

The method may further include attaching the substrate to the chuck using an electrostatic force generated by applying power to the chuck, before the first measuring is conducted. In the second measuring, a difference value between the first load of the lift unit before the lift unit compresses the substrate attached to the chuck and the second load of the lift unit when the substrate is detached from the chuck may be calculated, and an electrostatic force may be determined using the difference value.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for measuring a chuck attachment force, the apparatus comprising:
   a chuck configured to receive and attach a substrate thereto;
   a separating device that detaches the substrate from the chuck;
   a variable load applying device connected to the separating device, the variable load applying device operating the separating device by changing a load of the variable load applying device; and
   a controller that measures both a load of the variable load applying device when the substrate is attached to or contacts the separating device prior to detaching the substrate from the chuck and a load of the variable load applying device when the substrate is detached from the chuck, calculates a difference value therebetween, and determines a chuck attachment force using the difference value, wherein the separating device comprises:
      a lift device that detaches the substrate from the chuck; and
      a drive device that transmits a drive force to move the lift device, wherein the drive device comprises a power transmitting device that connects the variable load applying device to the lift device to transmit the drive force to the lift device, and wherein the power transmitting device comprises at least two pulleys and at least one power transmitting member coupled to the at least two pulleys.

2. The apparatus of claim 1, further comprising:
   at least one sensor provided in or on the chuck to detect whether the substrate is attached to or detached from the chuck.

3. The apparatus of claim 2, wherein at least one sensor comprises one selected from a pressure sensor, a magnetic sensor, or an optical sensor.

4. The apparatus of claim 1, wherein the lift device comprises at least one lift pin that contacts the substrate to transmit the drive force applied from the drive device to the substrate.

5. The apparatus of claim 4, further comprising:
   a lift plate that supports the at least one lift pin and a lift shaft that supports the lift plate.

6. The apparatus of claim 4, further comprising:
   a contact detecting sensor provided in the at least one lift pin that contacts the substrate to detect whether the at least one lift pin contacts the substrate.

7. The apparatus of claim 1, wherein the at least one power transmitting member comprises a wire or chain.

8. The apparatus of claim 1, wherein the chuck comprises an electrostatic chuck and the apparatus measures electrostatic force.

9. A method of measuring a chuck attachment force, the method comprising:
   placing a substrate onto a chuck;
   attaching the substrate to the chuck using an attachment force;
   moving a separating device by changing a load of a variable load applying device to detach the substrate from the chuck;
   measuring both a load of the variable load applying device when the substrate is attached to or contacts the separating device prior to detaching of the substrate from the chuck and a load of the variable load applying device when the substrate is detached from the chuck; and
   calculating a difference value between the load of the variable load applying device measured when the substrate is detached from the chuck and the load of the variable load applying device measured when the separating device is attached to or contacts the substrate prior to detaching the substrate from the chuck, and determining a chuck attachment force using the difference value, wherein the separating device comprising at least one lift pin, wherein the moving comprises moving the lift device upward to detach the substrate from the chuck, and wherein the calculating comprises calculating a difference value between the load of the variable load applying device measured when the lift device comes into contact with the substrate and the load of the variable load applying device measured when the substrate is detached from the chuck, and determining the chuck attachment force using the difference value, wherein the separating device further comprises a drive device that transmits a drive force to move the lift device, the drive device comprising a power transmitting device that connects the variable load applying device to the lift device to transmit the drive force to the lift device, and wherein the power transmitting device comprises at least one pulley and at least one power transmitting member coupled to the at least one pulley.

10. The method of claim 9, wherein the chuck comprises an electrostatic chuck and the attachment force comprises an electrostatic force.

11. An apparatus for measuring a chuck attachment force, the apparatus comprising:
- a chuck configured to receive and attach a substrate thereto;
- a separating device comprising a lift device that detaches the substrate from the chuck and a drive device that operates the lift device; and
- a load measuring apparatus that measures a first load of the lift device before the separating device contacts the substrate and a second load of the lift device when the substrate is detached from the chuck, the load measuring apparatus calculating an attachment force of the chuck using a difference value between the first load and the second load, wherein the lift device comprises:
  - at least one lift pin that vertically moves through at least one corresponding opening provided in the chuck; and
  - a lift plate that supports the at least one lift pin, wherein the drive device comprises a power transmitting device that connects the variable load applying device to the lift device to transmit the drive force to the lift device, and wherein the power transmitting device comprises at least one pulley and at least one power transmitting member coupled to the at least one pulley.

12. The apparatus of claim 11, further comprising:
a support device that supports the chuck.

13. The apparatus of claim 12, wherein the support device comprises a stage onto which the chuck is placed and a support frame that supports the stage.

14. The apparatus of claim 11, further comprising:
at least one sensor provided on or in the support device that detects whether the substrate is attached to or detached from the chuck and whether the at least one lift pin comes into contact with the substrate.

15. The apparatus of claim 14, further comprising:
at least one guide bar provided on the stage such that the plate is slidably coupled to the at least one guide bar, wherein the at least one guide bar guides vertical movement of the lift device.

16. The apparatus of claim 11, wherein the load measuring apparatus comprises:
- a load measuring device that measures the first load and the second load;
- a memory that stores a value of the first load and a value of the second load therein;
- an arithmetic device that calculates a difference value between the first load value and the second load value; and
- a display device that displays the difference value.

17. The apparatus of claim 11, wherein the chuck comprises an electrostatic chuck and the apparatus measures an electrostatic force.

* * * * *